US007280878B1

(12) United States Patent
Rossum

(10) Patent No.: US 7,280,878 B1
(45) Date of Patent: Oct. 9, 2007

(54) SAMPLE RATE CONVERTER HAVING DISTRIBUTED FILTERING

(75) Inventor: David P. Rossum, Monterey, CA (US)

(73) Assignee: Creative Technology Ltd, Singapore (SG)

( * ) Notice: Subject to any disclaimer, the term of this patent is extended or adjusted under 35 U.S.C. 154(b) by 0 days.

(21) Appl. No.: 09/427,815

(22) Filed: Oct. 27, 1999

(51) Int. Cl.
G06F 17/00 (2006.01)
G06F 17/17 (2006.01)
H03M 7/00 (2006.01)
(52) U.S. Cl. .................... 700/94; 708/313; 341/61
(58) Field of Classification Search .......... 700/94; 708/313; 375/285; 341/61, 123, 51; 381/89, 381/19; 713/313
See application file for complete search history.

(56) References Cited

U.S. PATENT DOCUMENTS

| | | | |
|---|---|---|---|
| 4,020,332 A | 4/1977 | Crochiere et al. | |
| 4,460,890 A | 7/1984 | Busby | |
| 4,709,278 A | 11/1987 | Lagadec | |
| 4,716,472 A | 12/1987 | McNally | |
| 4,780,892 A | 10/1988 | Lagadec | |
| 4,825,398 A | 4/1989 | Koch et al. | |
| 5,111,727 A | 5/1992 | Rossum | |
| 5,119,093 A | 6/1992 | Vogt et al. | |
| 5,342,990 A | 8/1994 | Rossum | |
| 5,621,805 A | 4/1997 | Loh et al. | |
| 5,647,008 A | 7/1997 | Farhangi et al. | |
| 5,717,617 A * | 2/1998 | Chester ................. | 708/313 |
| 5,808,924 A * | 9/1998 | White ................... | 708/313 |
| 5,818,888 A | 10/1998 | Holmqvist | |
| 5,880,980 A | 3/1999 | Rothacher et al. | |
| 5,892,694 A | 4/1999 | Ott | |
| 5,929,795 A * | 7/1999 | Wang ................... | 341/118 |
| 5,982,305 A * | 11/1999 | Taylor ................. | 341/61 |
| 6,337,999 B1 * | 1/2002 | Orban ................. | 700/94 |
| 6,360,239 B1 | 3/2002 | Laroche | |
| 6,487,573 B1 * | 11/2002 | Jiang et al. .......... | 708/313 |

OTHER PUBLICATIONS

Pohlmann, K. "Principles of Digital Audio", McGraw-Hill, Inc., 3$^{rd}$ Ed. 1995. pp. 57-60, 122-127.*
Udo Zölzer, "Digital Audio Signal Processing", John Wiley & Sons, Chapter 8, p. 221-247, England.

(Continued)

*Primary Examiner*—Sinh Tran
*Assistant Examiner*—Andrew C Flanders
(74) *Attorney, Agent, or Firm*—Schwegman, Lundberg & Woessner, P.A.

(57) ABSTRACT

A method and a computer program product for sample rate conversion that features distributive or hybrid filtering to reduce unwanted artifacts, such as aliasing and the computational requirements to avoid the aforementioned artifacts. The method includes receiving, at a first sample rate, a plurality of data points, associated with a first signal, operating on the plurality of data points to associate the signal with a predetermined set of parameters, with the set of parameters including a first transition band having an image associated therewith; and varying the sample rate associated with the first signal by interpolation with an interpolator having associated therewith a second transition band, with the width associated with the second transition band being a function of a spectral separation between the first transition band and its image, wherein a second signal is produced having a sequence of data samples approximating the first signal.

39 Claims, 12 Drawing Sheets

OTHER PUBLICATIONS

João M. de Carvalho and John V. Hanson, "Efficient Sampling Rate Conversion With Cubic Splines", pp. 19.5.1-19.5.4.

Dave Rossum, "Constraint Based Audio Interpolators", IEEE Workshop on Applications of Signal Processing to Audio and Acoustics, New Paltz, NY, 1993, 4 pages.

Hal Chamberlin, "Musical Applications of Microprocessors", Hayden Book Company, p. 515-525.

Vaidyanathan, "Multirate Systems and Filter Banks", pp. 196-217, Chap. 5, "Maximally decimated filter banks".

Tor A. Ramstad, "Digital Two-Rate IIR and Hybrid IIR/FIR Filters for Sampling Rate Conversion", IEEE Transactions on Communications, vol. COM-30, No. 7, pp. 1466-1476, Jul. 1982.

G.T.H. Wright and F.J. Owens, "Optimum Design of a FIR Interpolating Filter for Converting Between Incommensurate Sampling Frequencies", Applied Signal Processing, 1994, 4 pages.

Y. Medan and U. Shvadron, "Asynchronous Rate Conversion", 1997 IEEE, pp. 107-112.

Julius O. Smith and Phil Gossett, "A Flexible Sampling-Rate Conversion Method", Processing of ICCASP, 1984, Palo Alto, California, pp. 19.4.1-19.4.4.

Tor A. Ramstad, "Sample-Rate Conversion by Arbitrary Ratios", ICASSP, 1982, Norway, pp. 101-104.

Tor A. Ramstad, "Digital Methods for Conversion Between Arbitrary Sampling Frequencies", IEEE Transactions of Acoustics, Speech, and Signal Processing, vol. ASSP-32, No. 3, Jun. 1984, pp. 577-591.

Tapio Saramäki and Tapani Ritoniemi, "An Efficient Approach for Conversion Between Arbitrary Sampling Frequencies", 1996 IEEE, pp. 285-288.

Tapio Saramäki and Yrjö Neuvo, "Equal Ripple Amplitude and Group Delay Digital Filters for Sampling Rate Alteration", 1980 IEEE, pp. 597-600.

Tapio Saramäki, "Efficient Recursive Digital Filters for Sampling Rate Conversion", 1983 IEEE, Finland, pp. 1322-1326.

N. S. Vasanthavada, "A Note on the Computational Efficiency of the FIR Multistage Implementations of Franctional Sampling Rate Conversion", IEEE Transactions on Acoustics, Speech, and Signal Processing, vol. ASSP-33, No. 2, Apr. 1985, p. 475 and 477.

Håkan Johansson and Lars Wanhammer, "Two-Stage Polyphase Interpolators and Decimators for Sample Rate Conversions With Prime Numbers", ref TBD, pp. 1207-1210.

A. Tarczynski, W. Kozinski and G. D. Cain, "Sampling Rate Conversion Using Fractional-Sample Delay", 1994 IEEE, pp. III-285-III-288.

J. Janssen, D. Therssen, et al., "A New Principle/IC for Audio Sampling Rate Conversion", 96th Convention Audio Engineering Society, 1994, 15 pages.

J.O. Smith, "Adaptive Interpolated Time-Delay Estimation", pp. 5-11.

Timo I. Laakso, Vesa Välimäki, Matti Karjalainen, and Unto K. Laine, "Digital Filter Approximation of Fractional Delay-A Totorial Review", IEEE Trans. on Speech and Audio Processing, Mar. 18, 1993, pp. 1-41 odd.

Vesa Välimäki, Timo I. Laakso and Johnathan Mackenzie, "Elimination of Transients in Time-Varying Allpass Fractional Delay Filters With Application to Digital Waveguide Modeling", pp. 1-8, 43-57 odd.

Crochiere, Ronald E., et al., "6.6 Sampling Rate Conversion Between Systems", *Multirate Digital Signal Processing*, Prentice-Hall,(1983),283-286.

Crochiere, Ronald E., et al., "Chapter 2: Basic Principles of Sampling and Sampling Rate Conversion", *Multirate Digital Signal Processing*, Prentice-Hall,(1983),13-42.

Crochiere, Ronald E., et al., "Chapter 5: Multistage Implementations of Sampling Rate Conversion", *Multirate Digital Signal Processing*, Prentice-Hall,(1983),193-250.

Rabiner, Lawrence R., et al., "2.4.2 Decimation and interpolation of sampled waveforms", *Digital Processing of Speech Signals*, Prentice-Hall,(1978),26-32.

Smith, III, J. O., "Comments on Sullivan Karplus-Strong Article", *Computer Music Journal*, (1990?),10-11.

* cited by examiner

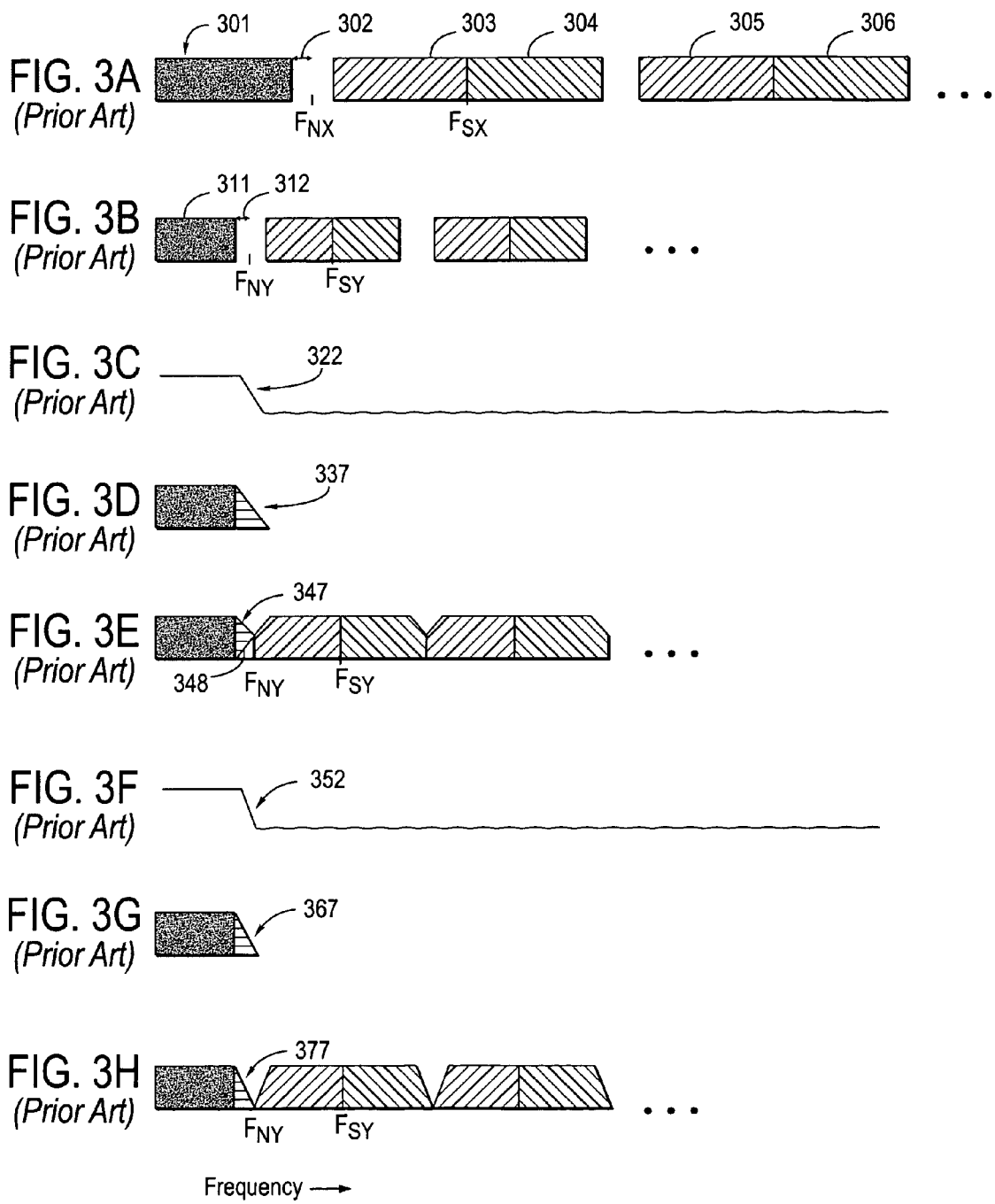

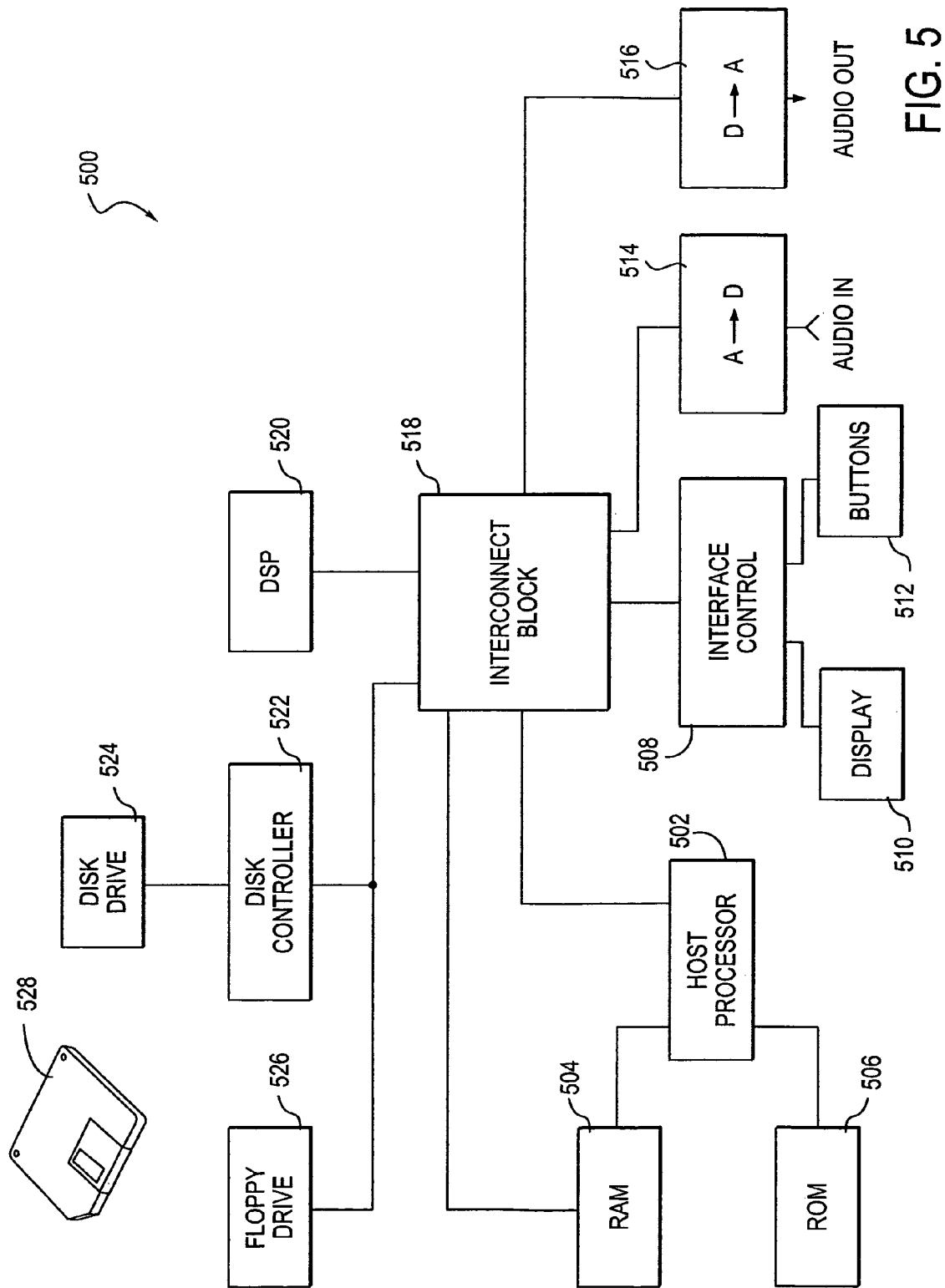

$X_n$ upsampling
filter $W_k$ interpolator interpolation
result

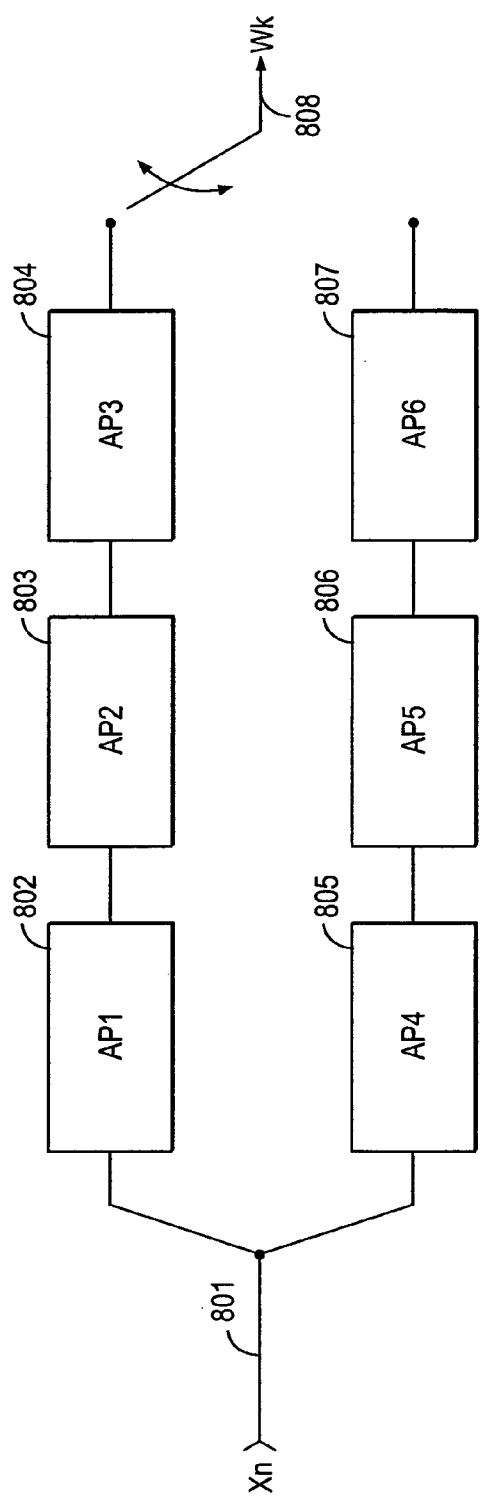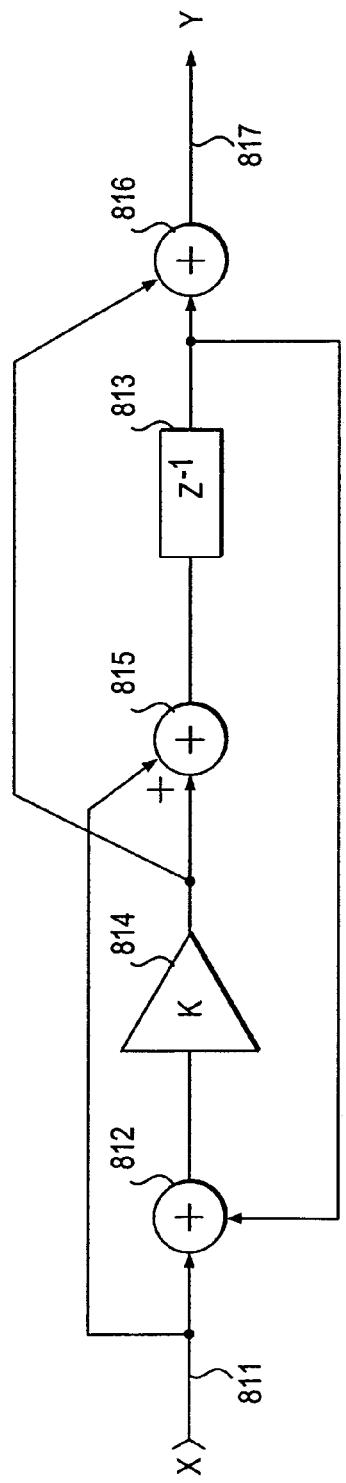
FIG. 8A
FIG. 8B

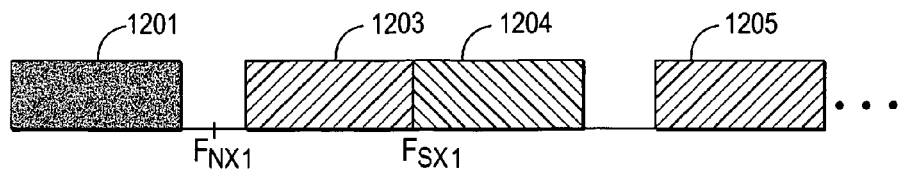
FIG. 12A $X_n^1$
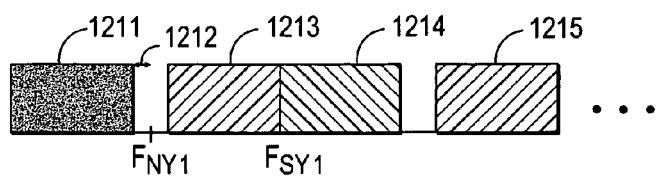
FIG. 12B $Y_m^1$ spectrum
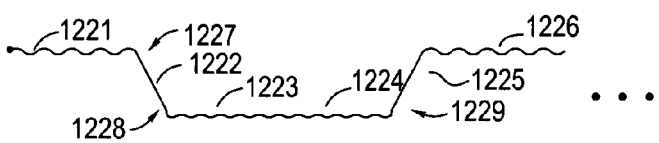
FIG. 12C half-band filter
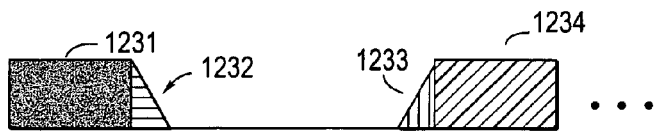
FIG. 12D intermediate signal
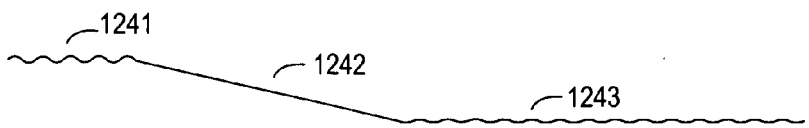
FIG. 12E interpolator
FIG. 12F interpolation result
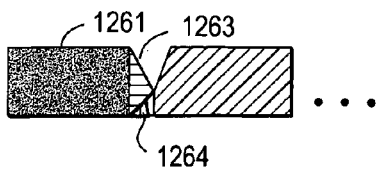
FIG. 12G $Y_m^1$ 48 kHz input spectrum 44.1 kHz spectrum interpolator filter intermediate signal half-band decimating filter half-band filtered prior to decimation decimated Output Signal Frequency →

$x_n^2$
FIG. 16A
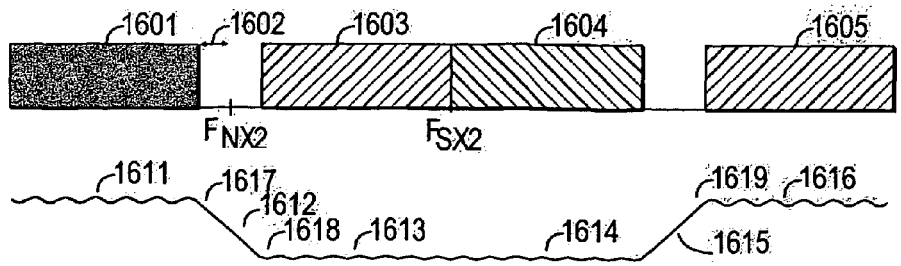
half-band
upsampling filter
FIG. 16B
1st Intermediate
signal
FIG. 16C
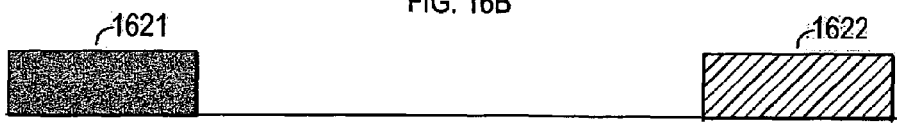
Interpolator filter
FIG. 16D
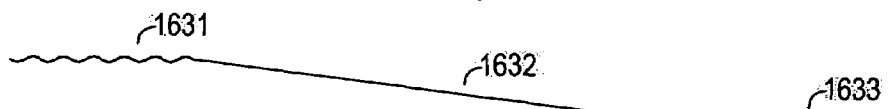
Interpolator filter
results
FIG. 16E
output signal
spectrum
allocation
FIG. 16F
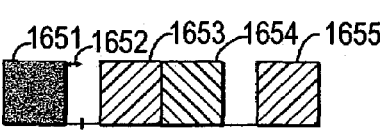
Half-band
decimating filter
FIG. 16G
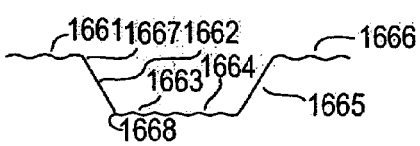
Half-band filter
results prior to
decimation
FIG. 16H
Decimated
output signal
FIG. 16I
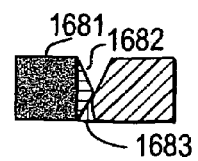

SAMPLE RATE CONVERTER HAVING DISTRIBUTED FILTERING

BACKGROUND OF THE INVENTION

In many electronic applications, signals are represented and processed digitally. Digital words, or samples, represent the value of the signal at a regular time interval. This regular interval is often referred to as the sample rate, and is typically expressed in units of kilohertz (kHz) representing the reciprocal of the sample interval time period. The signal thus represented can have no energy above half the sample rate; the frequency equal to half the sample rate is called the Nyquist frequency.

Practically, the signal thus represented must have its energy limited at some frequency below the Nyquist frequency. The band of frequencies which the signal is intended to contain is called the passband of the signal, and the upper frequency of the passband is called the passband edge. The band of frequencies between the passband edge and the Nyquist frequency is called the guardband. For example, for audio signals sampled at 48 kHz, the Nyquist frequency is 24 kHz, the passband edge is generally defined as 20 kHz, and the width of the guardband is 4 kHz.

There are situations when the available sample rate of the data is different from the desired sample rate. Depending on the characteristics of the sample data and how much the available and desired rates differ, several approaches may be used to convert the signal at one sample rate to a signal at another sample rate without substantially altering the meaning of the signal. A first common technique for sample rate reduction is called decimation. This technique is employed to reduce the sample rate of a signal by an integer divisor d. To reduce aliasing effects, any frequency components in the signal above the passband edge of the output sample rate are typically attenuated by applying a low pass filter to the incoming signal before reducing the sample rate. The rate reduction is performed by simply periodically discarding d−1 input samples of the signal, thus causing the output to consist of every $d^{th}$ filtered input sample.

A second common technique for sample rate conversion is known as up-sampling. This technique results in an increase of the sample rate of a signal by an integer factor u. The increased sample rate is achieved by augmenting the number of samples that represent the signal by inserting u−1 zero value samples between adjacent input samples. The resulting samples are typically filtered through an anti-imaging low pass filter at the higher output sample rate to remove frequency components above the original Nyquist frequency.

Typically, the decimation and up-sampling techniques are combined in a multi-stage converter to obtain a desired sample rate. The "classical" (prior art) multi-stage converter algorithm involves successive zero insertion, filtering, and decimating of a signal. For example, to change the sample rate of a signal sampled at rate R to a new rate R'=R*L/M, a number of zero value samples equal to L−1 are inserted between each sample of the signal (L and M are integers which can slowly change with time). This creates a signal at sample rate L*R. Lowpass filtering of the signal is applied that removes all frequencies above the lower of the Nyquist frequency associated with the original signal or the new Nyquist frequency associated with the signal at the converted sample rate. Then, the signal is decimated by the factor M by deleting all but every $M^{th}$ sample, producing a new signal at rate R'.

The computational complexity of the aforementioned sample rate conversion techniques is a function of the filter employed, which when properly designed depends on the width of the guardband. The guardband width should determine the width of the filter's transition band, which is the band of frequencies between the passband edge and the lower edge of the filter's stopband. The lower edge of the lowpass filter's stopband is the frequency above which all frequencies are attenuated at least as much as the stopband attenuation specification. Simply stated, the higher the quality of the filtering and the more narrow the guardband, the more computationally intensive the converter. Important characteristics to consider when determining the quality of a filter include stop-band attenuation, passband ripple, and numerical accuracy. Passband ripple in a sample rate converter results from variation in gain of the filter that is expressed as a worst case deviation in decibels from nominal gain. A high quality sample rate converter for audio will generally have a passband ripple less than +0.01 dB. While such values of ripple are far below the limit of audibility, they are important if the signal may be passed through a sample rate converter multiple times, as might occur in a recording studio.

The level of distortion in a sample rate converter is a function of the magnitude of aliases typically produced during decimation. These result from the non-ideal stopband attenuation of the filter in any real sample rate converter, which will cause some aliases to be produced by the decimation step. Aliasing may be measured by testing the converter with a full level sine waveform of varying frequency, noting the peak magnitude of any undesired components using the standard "peak THD+N" measurement technique. The ratio of the full level signal to the THD+N expressed in decibels, is the alias rejection of the converter at that signal frequency, which is directly related to the stopband attenuation of the filter and to the distortion of the converter. A high quality sample rate converter will have an alias rejection of more than 96 dB throughout the audio spectrum. It is worthy of note that the distortion caused by inadequate alias rejection is proportional to signal level. This is in marked contrast to quantization distortion or dither noise, both of which remain at a constant level regardless of signal level. Numerical accuracy of a filter depends intimately on the design details of the filter. In sample rate converters, the filter is generally designed so that the distortion resulting from numerical inaccuracy is substantially below the distortion generated by aliasing.

Classical Algorithm Single Stage Interpolation when Converting to Equal or Higher Sampling Rate with Equal or Wider Passband FIGS. 1A, 1B and 1C illustrate filter requirements for a prior art classical algorithm single stage interpolator when converting a signal to an approximately equal or higher sampling rate with an equal or wider passband, while meeting certain quality specifications. FIG. 1A shows the spectrum of the input signal at sample rate $F_{SX}$, including passband frequency range 101, guardband 102, first image 103, second image 104, third image 105, and fourth image 106. The images are redundant copies of the original passband frequency range whose production is inherent in the process of digital sampling. Images above the fourth are not shown. FIG. 1B shows the requirements for the filter of a single stage classical interpolator, including passband ripple 111, narrow transition band 112 with width less than twice the width of the guardband, beginning no lower than the upper edge of input signal passband 101 and ending below the bottom edge of the first passband image 103, and stopband 113 with finite attenuation. FIG. 1C shows the result of the interpolator filtering operation with passband 121 unchanged (apart from the effects of passband ripple) and all images attenuated by the stopband, thus preventing any significant aliasing when decimation occurs in the final interpolator operation.

One fundamental decision regarding performance of sample rate converters involves the interpretation of the guardband, the frequencies between the top of the passband and the Nyquist frequency. In particular, the choice must be made as to whether the filter stopband should begin at the Nyquist frequency, or at the first image of the passband edge. The latter case is less conservative, but requires approximately a factor of two less computation. The audible consequences of this choice are fairly subtle. If the less conservative choice is made, any energy present in the incoming signal above the input passband will result in aliases greater than the stopband limit, while the more conservative approach will not produce aliases under any conditions. When the conversion is to a lower sample rate, the additional aliases will always lie above the passband of the output sample rate. When the conversion is to a higher rate, they will lie well above the passband of the incoming rate. In both cases, if the lower of the passbands is assumed to be the limit of hearing, the aliases will be inaudible and hence of no consequence, which is discussed below with respect to FIGS. 2A-2G and 3A-3H.

Output Sample Rate Greater than Input Sample Rate

FIG. 2A shows the spectrum of the input signal at sample rate $F_{SX}$, including passband frequency range 201, input guardband 202, first image 203, second image 204, third image 205, and fourth image 206. Images above the fourth are not shown. Also shown is a signal component 207 within the guardband, and that signal's first image 208, and higher images 209. FIG. 2B shows a less conservative interpolator filter having a transition band 212 of twice the width of the input guardband. FIG. 2C shows the result of the interpolator filtering operation shown in FIG. 2B with signal 207 and image 208 both partially attenuated as filtered signals 227 and 228 respectively. FIG. 2D shows the result of the decimation operation on the signal of 2C when the output sample rate $F_{SY}$ is above the input rate, showing the results of signal 207 and image 208 above the input passband as signal components 237 and 238. FIG. 2E shows a more conservative interpolator filter having a transition band 242 of the same width as that of the guardband. FIG. 2F shows the result of the interpolator filtering operation shown in FIG. 2E with signal 207 partially attenuated as filtered signal 257, but image 208 completely attenuated to the stopband limit. FIG. 2G shows the result of the decimation operation on the signal of 2F when the output sample rate $F_{SY}$ is above the input rate, showing the results of signal 207 above the input passband as signal component 267, but notably with image 208 absent.

Output Sample Rate Less than Input Sample Rate

FIG. 3A shows the spectrum of the input signal at sample rate $F_{SX}$, including passband frequency range 301, input guardband 302, first image 303, second image 304, third image 305, and fourth image 306. Images above the fourth are not shown. FIG. 3B shows the output sample rate $F_{SY}$ which is lower than the input rate $F_{SX}$ and consequently has smaller output passband 311 and output guardband 312. FIG. 3C shows a less conservative interpolator filter having a transition band 322 of twice the width of the output guardband 312. FIG. 3D shows the result of the interpolator filtering operation of 3C with a portion of the input passband 301 partially attenuated as filtered frequency range 337.

FIG. 3E shows the result of the decimation operation on the signal shown in FIG. 3D when the output sample rate $F_{sy}$ is below the input rate, showing the results of signals in frequency range 337 as both signals 347 and aliases 348, both of which lie within the frequencies of the output guardband 312. FIG. 3F shows a more conservative interpolator filter having a transition band 352 of the same width as the output guardband 312. FIG. 3G shows the result of the interpolator filtering operation of 3F with a narrower portion of the input passband 301 partially attenuated as filtered frequency range 367. FIG. 3H shows the result of the decimation operation on the signal of 3G when the output sample rate $F_{SY}$ is below the input rate, showing the results of signals in frequency range 367 as signals 377 which lie within the frequencies of the output guardband 312, but with all aliases absent.

The performance measurement consequences of different guardband interpretations are more definite. If the converter is tested with input frequencies only below the lower of the passband limits, then either interpretation will meet the design specifications. However, if a converter going to a higher sample rate is tested with inputs containing energy in frequencies above the input passband limit, the aliases of these frequencies will exceed the stopband limit. If a converter going to a lower sample rate is tested with input frequencies above the output passband limit, and measured without a brick-wall filter at the output passband limit, then aliases above the stopband will be measured. In general, testing is limited to within the passbands, so the difference between the interpretations is generally not noted.

In the context of this disclosure, unless explicitly stated otherwise, it will be assumed that the guardband is interpreted in the less conservative manner, in which guardband aliases are acceptable. Thus for the case of the "classical" sample rate converter algorithm explained above, the filter is designed such that the transition band extends from the edge of the passband to the first image of the edge of the passband, thus having a width twice that of the guardband. In other words, for a comparable prior art "high quality" sample rate converter operating on audio at a sample rate of 48 kHz, the filter specifications would include passband ripple less than ±0.01 dB from 0 to 20 kHz, stopband rejection greater than 96 dB above 28 kHz, and a transition band of 8 kHz width from 20 to 28 kH, as previously described for FIG. 1.

Different Types of Sample Rate Converters

FIGS. 4A-4E illustrates the frequency domain behavior of a number of prior art, common, low complexity, sample rate converter techniques. FIG. 4A shows the spectrum of the input signal for any of these converters at a sample rate $F_{SX}$ including passband frequency range 401, input guardband 402, first image 403, second image 404, third image 405, and fourth image 406. Images above the fourth are not shown.

The simplest sample rate converter is called a "drop sample" interpolator, and uses a filter with a one sample wide rectangular impulse, which can be implemented with no computation at all. The complexity is very low because no arithmetic operations are required, and the quality is very poor. The frequency response of the filter associated with this sample rate converter is found by taking the magnitude of the Fourier transform of its impulse response, which is $\sin^2(\pi f/f_s)/(\pi f/f_s)$, where f is the frequency and $f_s$ is the sample rate. This frequency response is shown in FIG. 4B, and includes passband ripple 411 of magnitude approximately 2.6 dB, stopband rejection 412 of magnitude 13 dB, and transition band 413 which extends (at a sample rate of 48 kHz) from the 20 kHz input signal passband edge to 39 kHz, thus having a width of 19 kHz.

The next simplest sample rate converter is a linear interpolator. The complexity is one multiply and two adds per output sample, and the quality is considerably better than drop sample. The impulse response of the associated filter, a triangular function two samples in width, has Fourier transform $\sin(\pi f/f_s)/(\pi f/f_s)^2$. The associated frequency response is shown in FIG. 4C, and includes passband ripple 421 of magnitude approximately 5.3 dB, stopband rejection 422 of magnitude 27 dB, and transition band 423 which extends (at a sample rate of 48 kHz) from the 20 kHz input signal passband edge to 39 kHz, thus having a width of 19 kHz.

These two classical algorithm sample rate converters are generally classified as low quality and low complexity. While quantitative distortion measurements of these two converters can be made, the results for broadband signals are so poor as to be nearly meaningless. A linear interpolator works fairly well when the input signal energy is concentrated at very low frequencies (<1/10 of the Nyquist frequency).

Sample rate converters using the classical algorithm can be constructed from higher order mathematical interpolation techniques related to the drop sample and linear interpolators. One such family of interpolators are the splines, also called B-splines or (for the one of third order) cubic splines. The Fourier transform of the Nth order spline interpolator has been shown to be $\sin^n(\pi f/f_s)/(\pi f/f_s)^n$, sometimes abbreviated $\text{sinc}^n$. FIG. 4D shows the frequency response of several members (orders 3, 4, 7, 15 and 31) of the spline family, including passband ripples 431, stopbands 432, and transition bands 433 which in all cases extend (at a sample rate of 48 kHz) from the 20 kHz input signal passband edge to approximately 39 kHz, thus all having a width of 19 kHz. It is interesting to note that the transition band width of a spline is fixed and approximately independent of its order, and also to note that while the stopband rejection of higher order splines is quite good, the passband ripple of a spline becomes increasingly poorer with increased order. Thus, high order splines are typically not useful for high quality sample rate conversion.

Another family of interpolators are polynomial interpolators, which are generally implemented according to the method of Lagrange, hence called Lagrangian interpolators. A closed form of the frequency response of the Nth order Lagrangian interpolator is too complex to reproduce here, but FIG. 4E shows the frequency response of several members of this family (orders 3, 4, 7, 15 and 31). Note passband ripples 441, stopbands 442, and transition bands 443. It is noteworthy that while the transition bands of higher order Lagrangian interpolators become narrower with increasing order, the stopband rejection remains quite poor. Thus higher order Lagrangian interpolators are not useful for high quality sample rate conversion.

Drop sample, linear, spline and Lagrangian interpolators have also been used in multistage systems for sample rate conversion. Because of the above mentioned limitations in filter quality for such interpolators, a high degree of oversampling (typically 128 times) must be used to achieve high quality. The computational complexity of the required oversampling is a major drawback to this approach.

Sample rate converters using the classical algorithm can also be constructed using FIR (Finite Impulse Response) filters. For converters where the sample rate ratio is fixed, polyphase FIR filters are generally used. For variable sample rate ratios, an FIR filter impulse response is typically stored in a table and interpolated, most commonly using linear interpolation.

The FIR filters used in such sample rate converters are generally designed to meet the requirements illustrated in FIGS. 1A-1C. When a windowed sinc function is used, the width of the transition band and the filter quality can be independently controlled, but in general there is no independent control of stopband rejection and passband ripple. When optimization methods, such as linear programming or Remez exchange are used, independent and precise control of passband ripple, stopband rejection, and transition band width can be accomplished, even to the extent of further dividing the bands to produce filters with more precisely controlled frequency responses.

Intermediate quality sample rate converters can be constructed with FIR filter orders from four to sixteen. These converters can be specified for distortion of wideband signals, although in general the results are substantially inferior to distortion measurements for other digital audio subsystems. An Nth order FIR sample rate converter, using linear interpolation of the FIR filter coefficients, will have a computational complexity of 2N multiplies (one for the convolution and one for the linear interpolation) and 3N additions (one for the convolution and two for the linear interpolation) per output sample.

High quality sample rate converters attempt to equal the performance of typical high fidelity digital audio subsystems. They typically involve FIR filters with orders from thirty-two to several hundred.

The filter associated with a sample rate converter may be either an infinite impulse response (IIR) filter or a finite impulse response (FIR) filter. Applying an IIR filter in the "classical" algorithm, is usually useful when efficiency is not of great concern and R/R' (sample rate R/new sample rate R') is a ratio of small integers. The primary disadvantage of the method is that the IIR filter is only efficient with a low rate LR, because the IIR filter is recursive. Thus, each output sample from the IIR filter depends computationally on the previous outputs, and thus must be computed at the LR rate. Also, it is not practical to vary R/R' in real time because the restriction to small integer ratios (allowing LR to be small enough to be realizable) causes changes in rate to abruptly alter coefficients, producing audible defects.

Applying an FIR filter in the "classical" algorithm is much more practical than the IIR filter, because the FIR filter is not recursive. Output samples which are dropped during decimation need not be calculated. Similarly, multiplicative operations upon inserted zeroes in the incoming sample stream need never be performed. This implies that the computational complexity of this approach is independent of the value of L. In other words, a fixed number of multiply-add operations must be performed for each output sample. In general, despite the poorer efficiency of FIR filters in terms of computational steps to produce a desired filter specification, this approach is superior to the IIR approach except possibly when R/R' is a small integer ratio.

As can be seen, the main drawback of high quality sample rate converters involves the mathematical complexity that typically results from providing high quality filtering.

What is needed, therefore, is a sample rate conversion technique of high quality and reduced computational complexity.

SUMMARY OF THE INVENTION

The present invention is a method and a computer program product for sample rate conversion that features distributive (or hybrid) filtering to minimize unwanted artifacts such as aliasing, and which has low computational requirements while avoiding the aforementioned artifacts. The method includes receiving, at a first sample rate, a plurality of data points, associated with a first signal, operating on the plurality of data points to associate the signal with a predetermined set of parameters, with the set of parameters including a first transition band having an image corresponding thereto; and varying the sample rate associated with the first signal by interpolation with an interpolator having associated therewith a second transition band, with the width associated with the second transition band being a function of a spectral separation between the first transition band and its image, wherein a second signal is produced having a sequence of data samples approximating the first signal.

In this manner, the width of the second transition band may be relaxed. By relaxing the width of the second transition band, the computational requirements involved with varying the sample rate by interpolation are reduced, while the unwanted artifacts are substantially eliminated. To that end, varying the sample rate may produce output data samples associated with the second signal by convolving a predetermined finite number N of data points with an equal number of coefficients, with N being greater than two. The number N is determined by the desired converter quality and the allowable width of the second transition band, and the values of the coefficients are typically a function of the temporal spacing between the output data sample and the corresponding data points.

The present invention in one embodiment uniquely provides an interpolation filter with parameters that are independently adjustable. In particular, an FIR interpolator allows a wide transition band to be specified when the interpolator is programmed, while independently adjusting the passband ripple and stopband rejection to optimize the results.

The filtering is distributed or hybrid because, in a preferred embodiment, the interpolation filter is split into a halfband filter and a FIR or IIR interpolation filter. The halfband filter is a simple filter that can easily eliminate the first and second images. The elimination of these images allows the FIR or IIR to have a broad transition band, making its design simplier. The particular placement of the halfband filter preferrably is varied depending on the ratio of the desired output and input sample rates.

In a first embodiment, when the ratio R of the output sample rate divided by the input sample rate is greater than or approximately equal to one (e.g., 44 kHz to 48 kHz), the preferred embodiment includes up-sampling and filtering the plurality of data points by a factor of two before varying the sample rate. The halfband filter is included in the upsampling.

In a second embodiment, when the input sample rate is approximately twice the output sample rate (e.g., 96 kHz to 48 kHz), the halfband filter is used instead of upsampling, followed by the interpolation filter.

In a third embodiment, when the ratio of the output sample rate to the input sample rate is less than or approximately equal to one, yet significantly greater than $\frac{1}{2}''$ (e.g., 48 kHz to 44 kHz), the present invention includes filtering and decimating the plurality of data points after varying the sample rate.

In a fourth embodiment, when the ratio of the output sample rate to the input sample rate can be in a large range, and is only known to be larger than $1/[(2'')-1]$ yet another embodiment of the present invention combines up-sampling and decimation, with a halfband filter being used on each of these steps. In between, the interpolation filter is used.

BRIEF DESCRIPTION OF THE DRAWINGS

FIGS. 3A-3H are graphical representations showing the operational characteristics of a prior art sample rate converter operating to provide an output sample rate that is less than the input sample rate;

FIG. 5 is a block diagram of a signal processing system suitable for implementing the present invention;

FIG. 8A is a flow diagram of power symmetric half-band upsampling elliptical filter is accordance with the present invention;

FIG. 8B is a flow diagram of typical allpass filters shown above in FIG. 8A;

FIGS. 12A-12G are graphical representations of the operational parameters of the half-band filter and interpolator shown above in FIG. 11;

FIGS. 16A-16I are graphical representations of the operational parameters of the half-band filter and interpolator shown above in FIG. 15.

DESCRIPTION OF THE SPECIFIC EMBODIMENTS

Overall System

Figure 1A:
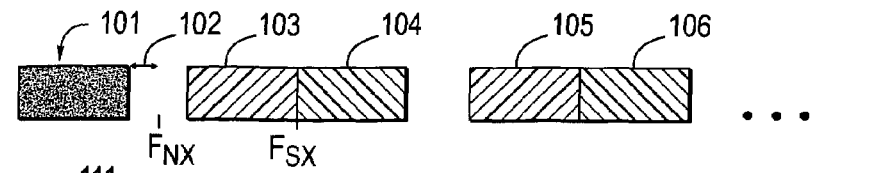
FIGS. 1A, 1B and 1C are graphical representations of filtering parameters for a prior art classical algorithm employed to achieve single stage interpolation when converting a signal to an approximately equal or higher sampling rate with an equal or wider passband.
Figure 1B:
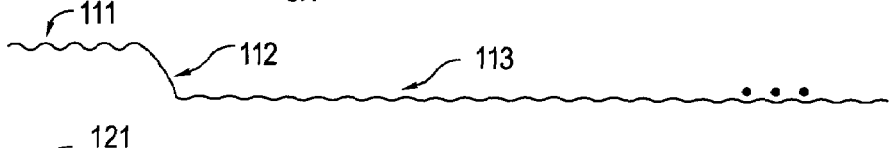
Figure 1C:
Figure 2A:
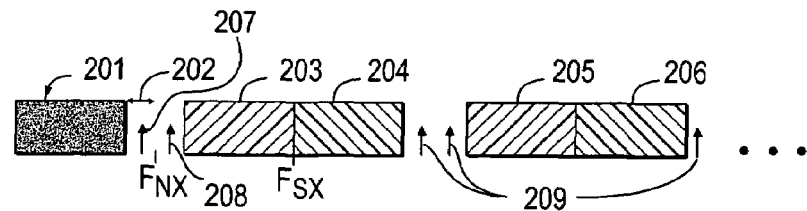
FIGS. 2A-2G are graphical representations showing operational characteristics of a prior art sample rate converter operating to provide an output sample rate that is greater than the input sample rate.
Figure 2B:
Figure 2C:
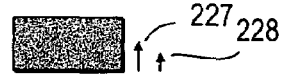
Figure 2D:
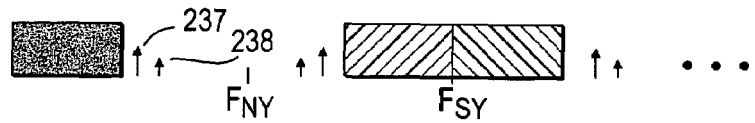
Figure 2E:
Figure 2F:
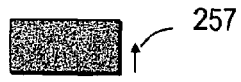
Figure 2G:
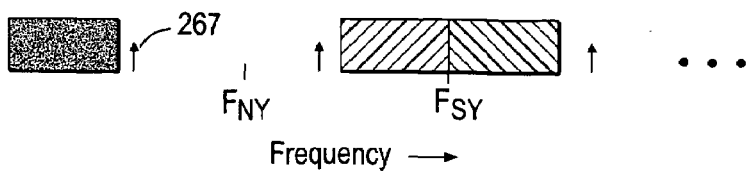
Figure 4A:
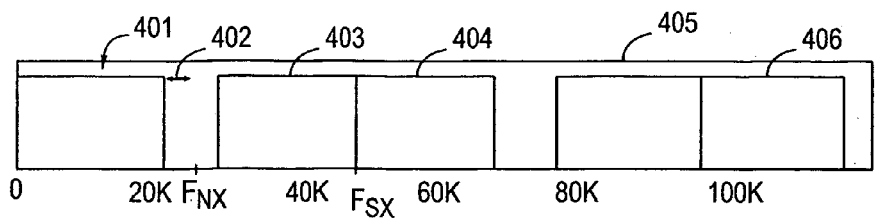
FIGS. 4A-4E are graphical representations showing the frequency domain behavior of various low complexity, prior art sample rate converter techniques.
Figure 4B:
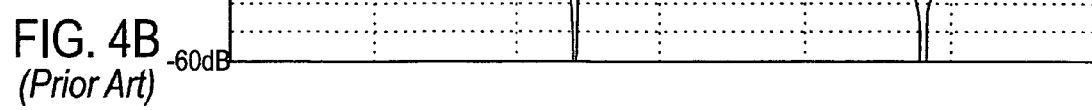
Figure 4C:
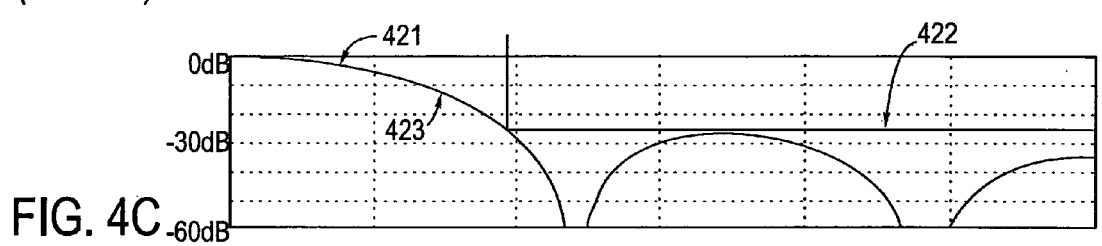
Figure 4D:
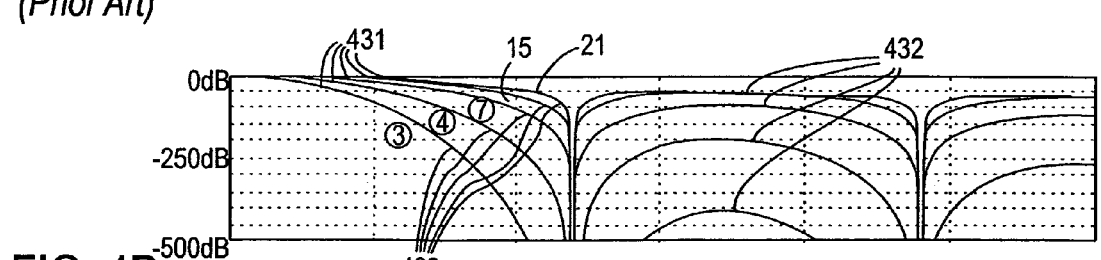
Figure 4E:
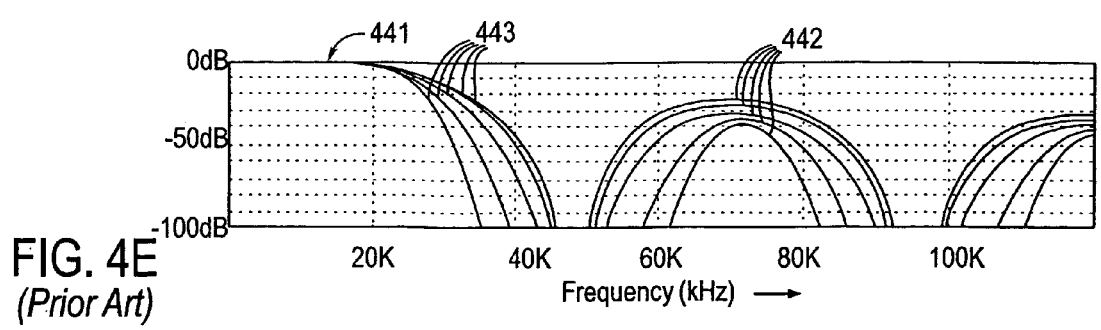

Referring to FIG. 5, a signal processing system 500 suitable for implementing the present invention is shown including a host processor 502, RAM 504, ROM 506, an interface controller 508, a display 510, a set of buttons 512, an analog-to-digital (A-D) converter 514, a digital-to-analog (D-A) converter 516, an interconnect block 518, a digital signal processor 520, a disk controller 522, a hard disk drive 524, and a floppy drive 526.

In operation, the signal processing system 500 captures samples of an analog signal, processes the samples, and outputs the processed samples. The present invention may be employed to process signals containing various types of information, such as audio information, control information and the like. To that end, A-D converter 514 converts analog signals to digital samples. Signal processing operations on the samples may be performed by host processor 502 or digital signal processor 520. Samples may be stored on hard disk drive 524 under the direction of disk controller 522. A user may request a particular signal processing operation using button set 512 and may view system status, or input or output waveforms on display 510. Once signals have been processed, they may be outputted using D-A converter 516 to convert samples to an analog signal.

The program control information for host processor 502 and DSP 520 is operably disposed in RAM 504. Long term storage of control information may be in ROM 506, on disk drive 524 or on a floppy disk 528 insertable in floppy drive 526. Interconnect block 518, which in one embodiment is an application-specific integrated circuit (ASIC), serves to interconnect and buffer between the various operational units. DSP 520 is preferably a 50 MHz TMS320C32 available from Texas Instruments. Host processor 502 is preferably a Pentium™ microprocessor available from Intel. Software to implement the present invention may be stored on a floppy disk 528, in ROM 506, on hard disk drive 524 or in RAM 504 at runtime. The ROM 506 stores information necessary to enable the signal processing system 500 to operate at differing sample rates while reducing the computational complexity to achieve the same. To that end, ROM 506 stores information that is operated on by host processor 502 or digital signal processor 520 to function as a sample rate converter capable of conversion by a rational, irrational or time varying ratio R. The ratio R is approximated by a rational value L/M, where L and M are integers that can slowly change with time.

It is also possible to design interconnect block 518 to perform the functions of DSP 520 in either a programmable or fixed algorithm form. Similarly, the DSP program can be contained in interconnect block 518, as can temporary information storage, if interconnect block 518 is an ASIC.

Sample Rate Converter

Figure 6:
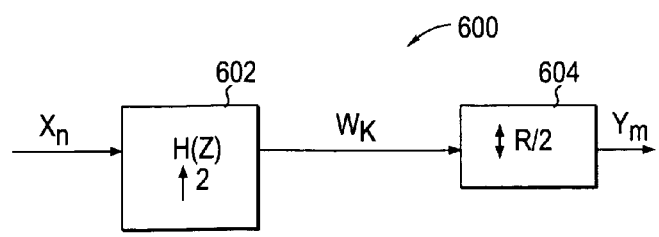
FIG. 6 is a block diagram of a sample rate converter, in accordance with the present invention.

In a first embodiment, shown in FIG. 6, information stored in ROM 506 defines a sample rate converter 600 that converts an incoming stream of data samples $x_n$, representing an input signal, at a first sample rate to a second stream $y_m$, nominally at an equal, or higher, sample rate. This is achieved by having an upsampling filter 602 coupled to an interpolator 604 such that the data sample $x_n$ are received by the filter 602. Although the interpolator 604 may consist of any known interpolation technique which can be parameterized for transition band width, it is preferred that interpolator 604 perform an Nth order FIR sum of products convolution on its input $w_k$ to produce each output $y_m$ such that $$y_m = w_{k-N/2+1} C_0(f) + w_{k-N/2+2} C_1(f)) + \ldots + w_{k+N/2} C_{N-1}(f)$$

where $y_m$ is the output sample interpolated at the fractional sample period f beyond sample k of signal w (i.e. m=k+f), and $C_i(f)$ is one of N coefficients which are computed by linearly interpolating from two values obtained from a table containing the impulse response of the FIR filter associated with the interpolator which has been designed to have the desired transition band width, passband ripple and stopband rejection characteristics.

An important consideration during sample rate conversion is to avoid aliasing. To that end, it is desirable to reduce, if not eliminate, energy corresponding to the input signal $x_n$ above the Nyquist frequency associated with the incoming sample rate. Typically, however, satisfying this criterion increases the computational complexity of the sample rate converter 600. To reduce the computational complexity of the sample rate converter 600 while satisfying this criterion, the interpolator 604 is designed so that the transition band associated therewith has a width that is greater than twice the width of the guardband of the signal $x_n$ received by the sample rate converter 600. In this manner, the computational complexity of the interpolator 604 may be relaxed. Relaxing the computational complexity of the interpolator 604 without sacrificing quality is achieved by over-sampling the input signal $x_n$. Although the input signal may be upsampled by any integer number, e.g., 2, 3, 6 and the like, it is preferred that upsampling be by a factor of 2. This ensures that the signal $w_k$ received by the interpolator 604 has no energy above half the Nyquist frequency associated therewith, which due to the upsampling by a factor of two is twice the Nyquist frequency of the incoming $x_n$. Effectively, the intermediate signal $w_k$ has a much wider guardband than the incoming signal $x_n$. For example, for an incoming 48 kHz signal $x_n$ with an original guardband extending from 20 kHz to 24 kHz, the guardband of the upsampled, filtered, and intermediate signal, $w_k$ at sample rate 96 kHz extends from 20 kHz to 48 kHz. Thus the width of the guardband has been increased from 4 kHz to 28 kHz, a factor of seven. With such a dramatically wider guardband, the transition width of the filter associated with interpolator 304 can be drastically increased and its complexity correspondingly reduced. For example, only a fourth order filter is required for 0.01 dB ripple and 96 dB stop-band attenuation, compared to a requirement of $28^{th}$ order to achieve the same specifications without upsampling. Table 1 shows quality specifications for various orders of the interpolator 604 as follows:

TABLE 1

|  | 48 kHz Output Rate | | | | 44.1 kHz Output Rate | | | |
|---|---|---|---|---|---|---|---|---|
|  | GB Aliases OK | | No GB Aliases | | GB Aliases OK | | No GB Aliases | |
| Order | Ripple | SB | Ripple | SB | Ripple | SB | Ripple | SB |
| 4 | 0.01 | −96 | 0.015 | −96 | 0.14 | −96 | 0.3 | −96 |
| 5 | 0.001 | −112 | 0.001 | −99 | 0.01 | −105 | 0.013 | −96 |
| 6 | 0.0001 | −128 | 0.0001 | −113 | 0.001 | −116 | 0.001 | −104 |
| 7 | 0.00001 | −144 | 0.00001 | −126 | 0.0001 | −128 | 0.0001 | −114 |
| 8 | 0.000001 | −159 | 0.000002 | −152 | 0.00002 | −142 | 0.0001 | −143 |

When linear phase is a system requirement, it is preferred that upsampling filter 602 be an FIR half-band upsampling filter. When employed with the interpolator 604, the system's computational complexity can be approximately halved compared to forming a converter 600 without the filter 602, while satisfying the same converter quality requirements. An example of the filter 602 orders required to achieve certain levels of quality for two standard sample rates is shown below in Table 2.

TABLE 2

| 48 kHz Input Rate (Passband Edge 5/6 Fn) | | | 44.1 kHz Input Rate (Passband Edge 10/11 Fn) | | |
|---|---|---|---|---|---|
| Order | Ripple | SB atten | Order | Ripple | SB atten |
| 77 | 0.00015 | −96 | 141 | 0.00015 | −96 |
| 89 | 0.00004 | −108 | 157 | 0.00004 | −108 |
| 101 | 0.00001 | −120 | 177 | 0.00001 | −120 |
| 113 | 0.000001 | −132 | 197 | 0.000002 | −132 |
| 121 | 0.0000002 | −144 | 217 | 0.0000005 | −144 |

It is preferred that the half-band upsampling filter attenuate the first image of the signal $x_n$. The actual filter design criterion is that the half-band upsampling filter passband extend through the passband of $x_n$, that the filter transition band extend from the passband edge of $x_n$ to the first image of the passband edge (thus having a transition band width of twice the guardband of $x_n$ and having the stopband extend from the first image of the passband edge to the new Nyquist frequency at the sample rate of $x_n$). Any number of FIR filter design methods could be used to design this filter, but the preferred method is a windowed sinc function. A Chebyshev window is typically used, but a Kaiser window will produce similar results. Because of the use of a windowed sinc function, the computational complexity of an FIR half-band upsampling filter is reduced. This is because the value of the center coefficient will be unity, and the value of all coefficients spaced an even number away from the center will be zero. Consequently, when so designed, the filter 602 passes the input data unchanged to produce half the output data as unaltered sample points. When the remaining half of the data, which are interpolated points, are computed, the left and right hand lobes of the filter are symmetrical, so the associated data points can be added together before multiplication and summation. Thus, if the order of the half-band upsampling filter 602 is 4n+1, a total of n multiplicative operations and 2n additive operations are performed for each input sample.

The computational complexity of the half-band upsampling filter is proportional to the rate of the input, because the filter operates on the incoming sample stream. As a result, the maximum input rate is nominally the output rate. In the case of hardware implementations, reservations may be made such that the input rate can slightly exceed the output rate, so that inaccuracy and drift can be accommodated when receiving asynchronous input data at nominally the same sample rate.

First Embodiment

Figure 7A:
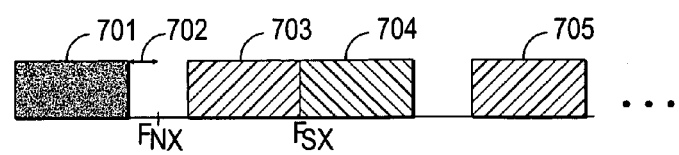
FIGS. 7A-7E are graphical representations of the parameters of an upsampling filter and interpolator in accordance with the present invention.

Halfband Filter in Upsampler when Output Sample Rate Approx. Equal to or Higher than Input Sample Rate The parameters of the upsampling filter and of the interpolator for this case when the output signal has approximately the same or wider passband than the input signal (which is generally the case when the output sample rate is approximately equal to or higher than the input rate) are illustrated in FIGS. 7A-7E. FIG. 7A shows the spectrum of the signal $X_n$, including passband frequency range 701, guardband 702, first image 703, second image 704, and third image 705. Images above the third are not shown.

Figure 7B:
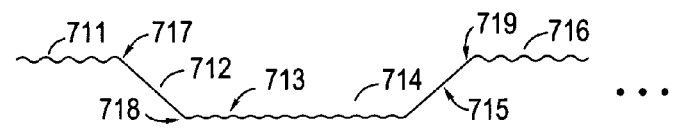

The desired parameters for half-band upsampling filter 602 are shown in FIG. 7B. These include passband ripple 711, transition band 712 of width less than or equal to twice the guardband whose lower end 717 must be no lower than the upper edge of input signal passband 701, and whose upper end 718 must be below the lower edge of the first passband image 703, and stopband 713 with finite attenuation. Also shown are the first images of the filter stopband, transition band and passband as 714, 715 and 716 respectively, and first image 719 of the lower end 717 of transition band 712.

Figure 7C:

FIG. 7C shows the spectrum of intermediate signal Wk, including passband 721 and the lowest unfiltered passband image 722.

Figure 7D:

FIG. 7D shows the desired parameters for the filter of interpolator 604, including passband ripple 731, wider transition band 732 whose lower end is no lower than the lower end 717 of half-band filter transition band 712, and whose upper end is below the first image 719 of the lower end 717 of half-band filter transition band 712, and stopband 733 with finite attenuation.

Figure 7E:

FIG. 7E shows the result of the interpolator filtering operation with passband 741 unchanged (apart from the effects of passband ripple) and all images attenuated by the stopbands, thus preventing any significant aliasing when decimation occurs in the final interpolator operation.

It should be clear that because the passbands of the half-band upsampling filter and the interpolator are both applied to the signal passband, in general the sum of these parameters must be below the required system ripple specification. In practice it will be found that the passband ripple of half-band filters with appropriate stopband rejection is exceedingly small compared to that of the interpolator filter, and thus this situation is easily arranged. Similarly it should be clear that in the general case, the transition band and stopband regions of the filters ultimately have both filters applied, thus in some instances advantage may be taken of this situation to relax the constraints while still achieving the required system requirements.

For purposes of comparison, the preferred embodiment requires a $4^{th}$ order interpolator and a $77^{th}$ order half-band upsampling filter, for a total complexity of 19+8=27 multiplications and 38+12=50 additions, while the prior art classical algorithm requires a $28^{th}$ order interpolator of complexity 56 multiplications and 84 additions to achieve the same specifications of 0.01 dB ripple and 96 dB stopband attenuation. An additional benefit of the preferred embodiment over the prior art is a reduction in the table size for the coefficients for the interpolator by a factor of seven.

IIR Upsampling Filter where Linear Phase not Required

Where linear phase is not a system requirement, an IIR half-band upsampling filter offers still further computational advantages, compared with the aforementioned FIR half-band filter. A particular form of IIR filter, the power symmetric elliptical filter, is optimal for this purpose. Such filters can be implemented in a variety of ways known to those skilled in the art. A preferred implementation flow diagram for a sixth order filter is shown in FIG. 8A. Input 801 is passed through first order allpass filters 802, 803, and 804, and in parallel through first order allpass filters 805, 806 and 807. Output 808 commutates between the outputs of allpass 804 and 807 to produce the upsampled signal at twice the input rate. Each first order allpass filter can be constructed in a variety of ways known to those skilled in the art. A preferred implementation flow diagram is shown in FIG. 8B. Allpass input 811 is summed in adder 812 with the output of unit delay element 813 and multiplied by coefficient K in multiplier 814. Subtractor 815 deducts the output of multiplier 814 from input 811, and applies the difference to unit delay element 813. Adder 816 sums the output of unit delay element 813 with the output of multiplier 814 to produce allpass output 817. The values of the coefficients K can be determined according to the references for any required specifications.

Table 3, below, shows the specifications for an exemplary IIR power symmetric elliptical half-band upsampling filter:

TABLE 3

| 48 kHz Input Rate (Passband Edge 5/6 Fn) | | | 44.1 kHz Input Rate (Passband Edge 10/11 Fn) | | |
|---|---|---|---|---|---|
| Order | Ripple | SB atten | Order | Ripple | SB atten |
| 6 | <.0000001 | −96 | 6 | <.0000001 | −78 |
| 8 | <.0000001 | −128 | 8 | <.0000001 | −103 |
| 10 | <.0000001 | −159 | 10 | <.0000001 | −129 |
| 12 | <.0000001 | −190 | 12 | <.0000001 | −155 |

Figure 9:
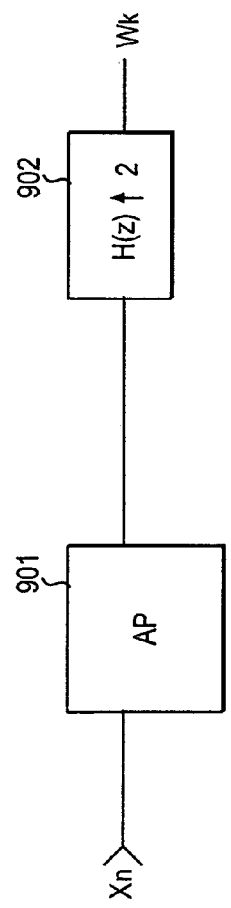
FIG. 9 is a simplified plan view of a compensating circuit where a first order allpass filter partially compensates phase nonlinearity of a power symmetric elliptical half-band filter, in accordance with the present invention.

As can be seen, very substantial gains in computational complexity derive from use of the IIR filter. A power symmetrical elliptical upsampling filter of order n requires n multiplicative operations and 3n additive operations for each input sample. Thus, for example, an implementation at 48 kHz with 0.01 dB ripple and 96 dB stopband rejection takes only a 4th order interpolator, and an order 6 IIR half-band upsampling filter. This requires 6+8=14 multiplicative operations and 18+12=30 additions, reducing multiplicative operations to 25%, and additive operations to 36%, of that required by the classical algorithm. At lower input rates, the efficiency is even higher. The phase non-linearity of the IIR filter can also be reduced by addition of a low order allpass stage with a compensating phase characteristic in series with the IIR filter. FIG. 9 shows such a compensating circuit, where first order allpass filter 901 partially compensates for the phase nonlinearity of power symmetrical elliptical upsampling half-band filter 902.

Figure 10:
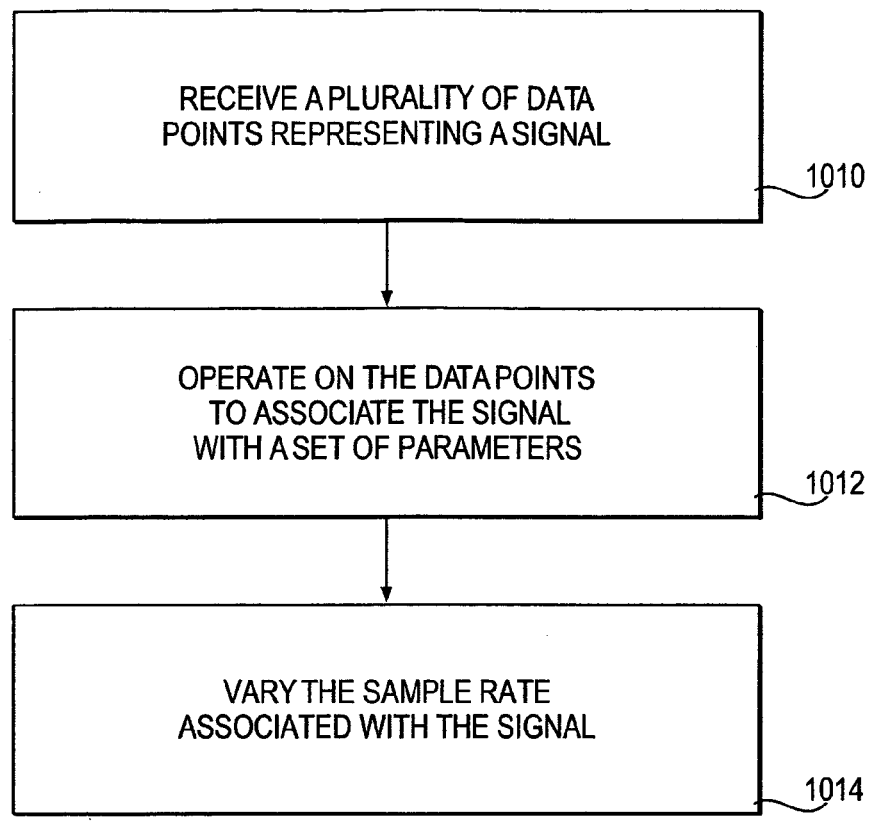
FIG. 10 is a flowchart describing steps for converting a signal to differing sample rates using the processing system shown above in FIG. 5 to produce the sample rate converter shown in FIG. 6.

Flow Chart (FIG. 10).

Referring to FIG. 10, in operation, any one of the embodiments discussed above with respect to the sample rate converter 600 would receive a plurality of data points, associated with the signal $x_n$, at a first sample rate at step 1010. At step 1012, the filter 602 would operate on the plurality of data points to associate the signal with a predetermined set of parameters forming signal $w_k$. The parameters associated with the signal are stopband rejection, passband ripple, numerical accuracy and transition band having a first width. At step 1014, the sample rate associated with the input signal $x_n$ and, therefore, the intermediate signal $w_k$ is varied by interpolating a subset of data points of the plurality of data points with the interpolator 604. Having associated therewith a transition band with a width that is greater than the width associated with the transition band of the intermediate signal $w_k$, the interpolator 604 is much less computationally complex, for the reasons discussed above. Specifically, during step 1014, the interpolator 604 varies the sample rate by convolving a predetermined finite number N of data points of the signal $w_k$ with an equal number of coefficients derived from those stored in ROM 506. Typically, N is determined by the desired converter quality and the allowable width at the second transition band, and the values of the coefficients are typically a function of the temporal spacing between the output data sample and the corresponding data points. In this manner, the sample rate converter increases, or changes, to a different but nominally similar rate, the sample rate of signal $x_n$.

Second Embodiment

Figure 11:
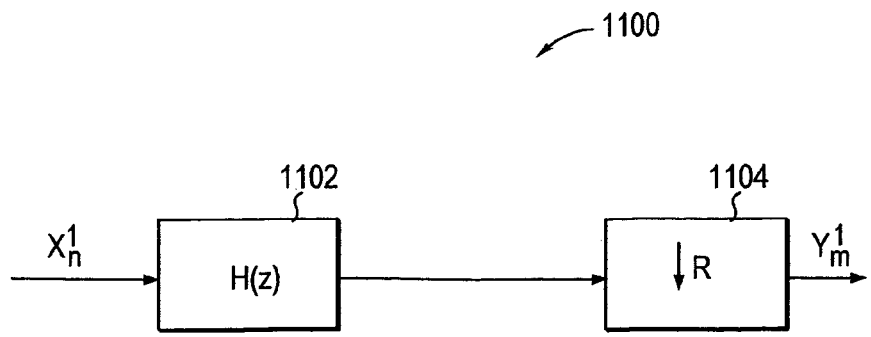
FIG. 11 is a block diagram of a sample rate converter, in accordance with an alternate embodiment of the present invention.

Halfband Filter Instead of Upsampling when Input Sample Rate is Approximately Twice Output Sample Rate Referring to FIGS. 5 and 11, in another embodiment of the present invention, information stored in ROM 506 defines a sample rate converter 1100 that converts an incoming stream of data samples $x^1_n$, representing an input signal, at a first sample rate to a second, lower, sample rate $y^1_m$. As before, oversampling can again serve to reduce the computational complexity of converter 1100. For example, when the input sample rate is nominally (but not necessarily exactly) twice the output sample rate, a half-band (but not upsampling) filter may be employed with an interpolator. Rather than oversampling the input signal $x^1_n$ by a factor of two, as discussed above, the samples representing the input signal $x^1_n$ are simply filtered. Either FIR or IIR filters may be employed, and the same coefficients derived previously can be used. To that end, the converter 1100 includes a half-band filter 1102 coupled to an interpolator 1104 such that the data samples $x^1_n$ are received by the filter 1102. Such a configuration is particularly useful for converting from a sample rate of nominally 96 kHz to a local 48 kHz rate. By placing slightly tighter constraints on the interpolator 1104, the same system can also convert 88.2 kHz sample rate data to the local 48 kHz rate.

The parameters of the half-band filter 1102 and of the interpolator 1104 for this case are illustrated in FIGS.

12A-12G. FIG. 12A shows the spectrum of the input signal $X^1{}_n$, including passband frequency range 1201, first image 1203, second image 1204, and third image 1205. Images above the third are not shown.

FIG. 12B shows the spectrum allocation of the output signal $Y^1{}_m$, including passband frequency range 1211, guardband 1212, first image 1213, second image 1214, and third image 1215. Images above the third are not shown.

The desired parameters for half-band filter 1102 are shown in FIG. 12C. These include passband ripple 1221, transition band 1222 of width less than or equal to twice the output guardband whose lower end 1227 must be no lower than the upper edge of output signal passband 1211, and whose upper end 1228 must be below the lower edge of the first output passband image 1213, stopband 1223 with finite attenuation, and first images of the stopband, transition band and passband as 1224, 1225 and 1226 respectively. Also shown is the first image 1229 of transition band upper end 1228.

FIG. 12D shows the spectrum of intermediate signal, including passband 1231, partially attenuated input signal 1232, the first image of the partially attenuated signal 1233 and first image of passband 1234.

FIG. 12E shows the desired parameters for the filter of interpolator 1104, including passband ripple 1241, wider transition band 1242 which must begin no lower than the lower end 1227 of half-band filter transition band 1222, and which must end below the first image 1229 of the upper end 1228 of half-band filter transition band 1222, and stopband 1243 with finite attenuation.

FIG. 12F shows the result of the interpolator filtering operation with passband 1251 unchanged (apart from the effects of passband ripple) and all images attenuated by the stopbands except for the partially attenuated input signal 1253.

FIG. 12G shows the output signal $Y^1{}_m$, including passband 1261 unchanged (apart from the effects of passband ripple) and partially attenuated input signal 1263 and its alias 1264 limited entirely to within the output guardband, thus containing no significant aliasing within the passband.

Third Embodiment

Figure 13:
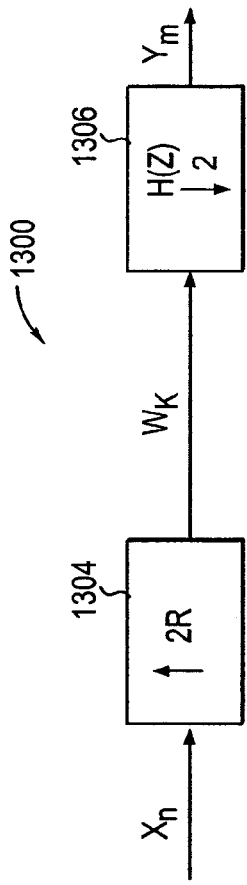
FIG. 13 is a block diagram of a sample rate converter, in accordance with a second alternate embodiment of the present invention.

Interpolator Followed by Halfband Decimating Filter for Output Sample Rate Less than or Approximately Equal to, but More than Half, the Input Sample Rate Referring to FIGS. 5 and 13, were the output sample rate less than or approximately equal to the input sample rate, but well above half of the same, then it would be preferred to have a sample rate converter 1300 with an interpolator 1304 producing an intermediate signal at exactly twice the output sample rate. The interpolator 1304 is followed by a half-band decimating filter 1306 having a sharp cutoff. In this manner, the interpolator 1304 need only reduce aliasing above the bottom of the fourth image of the passband at the output sample rate, because the half-band decimating filter 1306 effectively eliminates everything below this image. In other words, the transition band of interpolator 1304 can extend from the edge of the passband of the (lower rate) output signal through the first image of the passband edge of the input signal. For example, were the converter used to convert 48 kHz sample rate data to an output rate of 44.1 kHz, the interpolator's transition band could extend from 20 kHz to 68.2 kHz. The half-band decimating filter 1306 may be implemented as an FIR or IIR filter, depending on system requirements. Were an IIR filter selected, the preferred embodiment would include a power symmetric half-band decimating elliptical filter, which can be implemented in a variety of ways known to those skilled in the art.

Figure 8C:
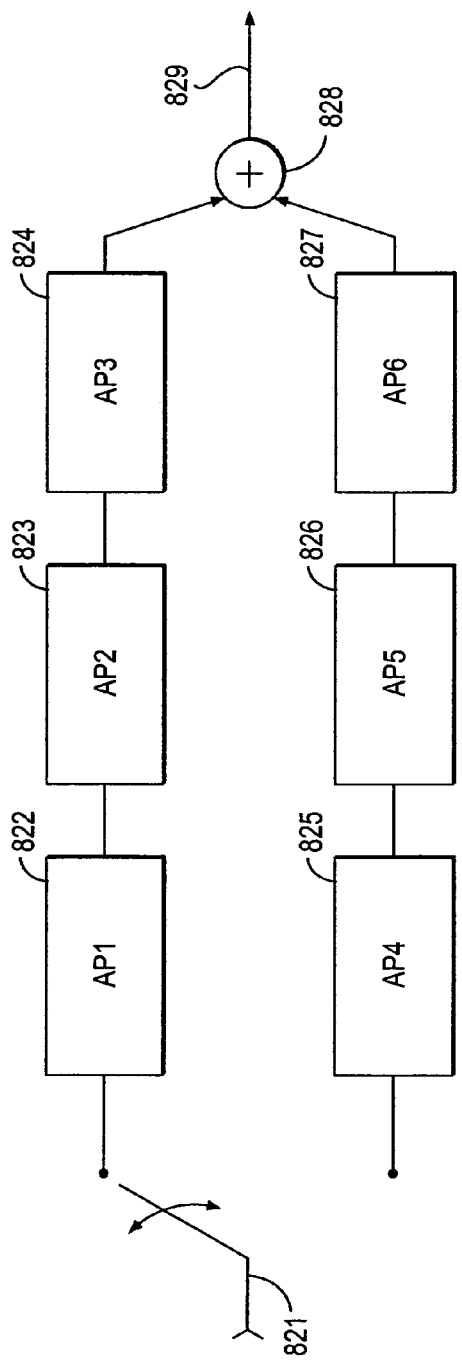
FIG. 8C is a flow diagram for an IIR filter power symmetric half-band decimating elliptical filter in accordance with the present invention.

A preferred implementation flow diagram for a sixth order version of such a power symmetric half-band decimating elliptical filter is shown in FIG. 8C. Input 821 is alternately commutated to a chain of first order allpass filters 822, 823, and 824, and to the other chain of first order allpass filters 825, 826 and 827. Adder 828 sums the outputs of allpass 824 and 827 to produce the decimated output signal 829 at half the input rate. As in the other embodiments, the computational efficiency of the half-band filter in providing a sharp transition band allows the combined system to be substantially more computationally efficient than traditional methods.

Figure 14A:
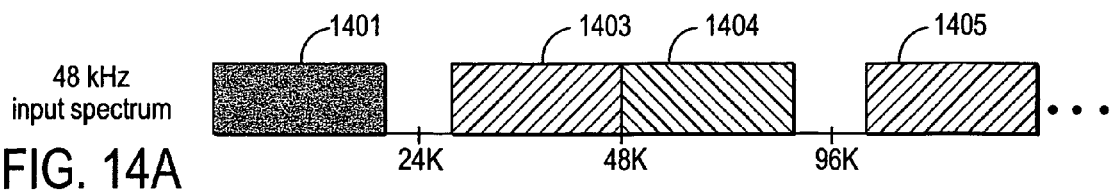
FIGS. 14A-14G are graphical representations of the operational parameters of the half-band filter and interpolator shown above in FIG. 13.

The parameters of the half-band decimating filter 1306 and of the interpolator 1304 (shown in FIG. 13) for this example are illustrated in FIGS. 14A-14G. FIG. 14A shows the spectrum of the 48 kHz input signal, including passband frequency range 1401, first image 1403, second image 1404, and third image 1405. Images above the third are not shown.

Figure 14B:
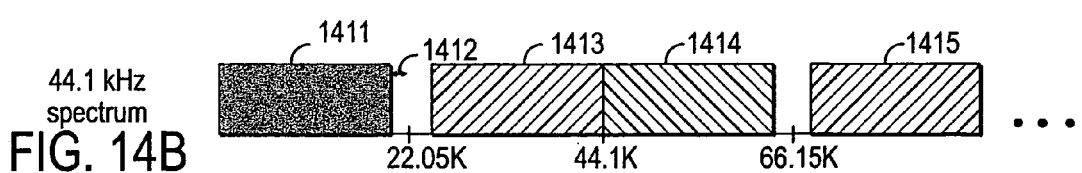

FIG. 14B shows the spectrum allocation of the 44.1 kHz output signal, including passband frequency range 1411, guardband 1412, first image 1413, second image 1414, and third image 1415. Images above the third are not shown.

Figure 14C:
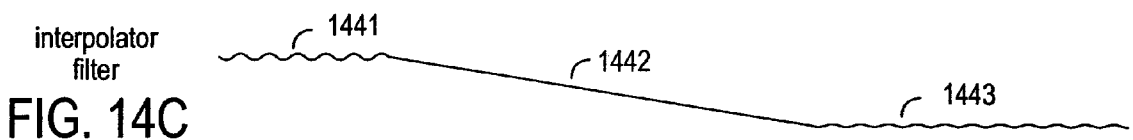
Figure 14D:
Figure 14E:
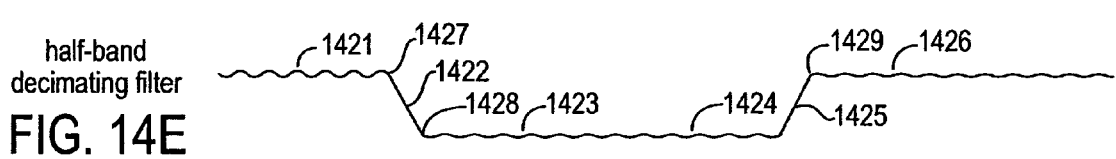

The desired parameters for half-band decimating filter 1306 are shown lower in FIG. 14E. These include passband ripple 1421, transition band 1422 of width less than or equal to twice the output guardband whose lower end 1427 must be no lower than the upper edge of output signal passband 1411, and whose upper end 1428 must be below the lower edge of the first output passband image 1413, stopband 1423 with finite attenuation, and first images of the stopband, transition band and passband as 1424, 1425 and 1426 respectively. Also shown is the first image 1429 of transition band lower end 1427.

FIG. 14C shows the desired parameters for the filter of interpolator 1304, including passband ripple 1441, wider transition band 1442 which must begin no lower than the lower end 1427 of half-band filter transition band 1422, and which must end below the first image 1429 of the lower end 1427 of half-band filter transition band 1422, and stopband 1443 with finite attenuation.

FIG. 14D shows the intermediate signal produced as a result of the interpolator filtering operation with passband 1451 unchanged (apart from the effects of passband ripple) and all images attenuated by the stopband except for the partially attenuated input images 1453.

Figure 14F:

FIG. 14F shows the spectrum of the signal resulting from the half-band filtering operation prior to decimation, including passband 1431 and partially attenuated input image 1432.

Figure 14G:
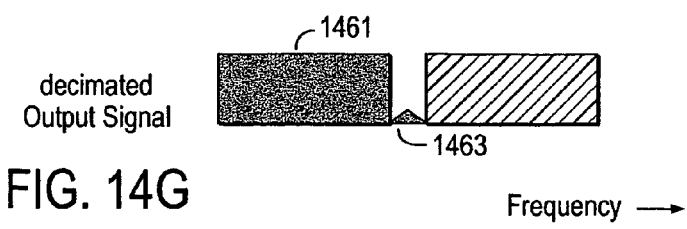

FIG. 14G shows the decimated output signal, including passband 1461 unchanged (apart from the effects of passband ripple) and partially attenuated input image alias 1463 limited entirely to within the output guardband, thus containing no significant aliasing within the passband.

Fourth Embodiment

Figure 15:
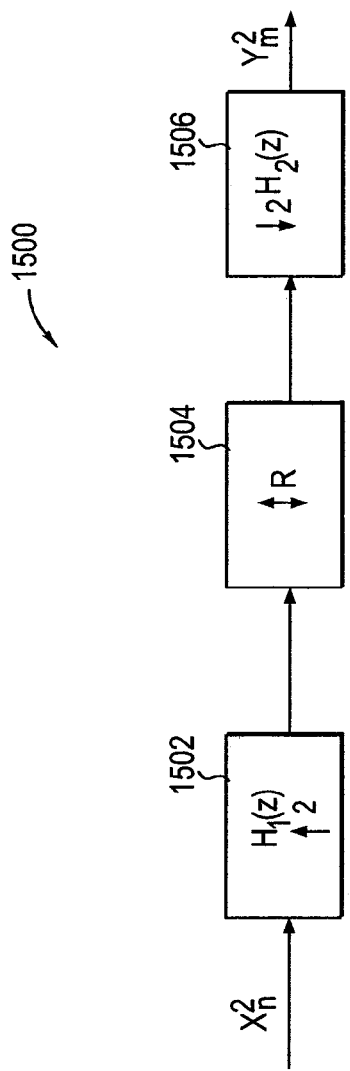
FIG. 15 is a block diagram of a sample rate converter, in accordance with a second alternate embodiment of the present invention.

Halfband Filter on Both Upsampling and Decimation where Dynamically Changing Sample Rate Referring to FIG. 15, the advantage of the preferred embodiment of the interpolator in all of the aforementioned sample rate converters is that it facilitates providing a dynamically changing sample rate. As a result, the sample rate ratio may dynamically change. Consider, for example, a sample rate converter 1500 that provides sample rate ratios from slightly more than ⅓ to infinity (in practice an arbitrarily high value). In this case, the input signal $x^2_n$ is first upsampled by a factor of two using a half-band upsampling filter 1502. The sample rate is then converted to twice the desired output rate using a wide transition band interpolator 1504. Finally, the output of the interpolator is decimated by a factor of two using a half-band decimating filter 1506, as described above producing output signal $y^2_m$.

The parameters of the upsampling and decimating filters and of the interpolator for this case are illustrated in FIG. 16. FIG. 16A shows the spectrum of the signal $X^2_n$ including passband frequency range 1601, guardband 1602, first image 1603, second image 1604 and third image 1605. Images above the third are not shown.

The desired parameters for half-band upsampling filter 1502 are shown in FIG. 16B. These include passband ripple 1611, transition band 1612 of width less than or equal to twice the guardband 1602 whose lower end 1617 must be no lower than the upper edge of input signal passband 1601, and whose upper end 1618 must be below the lower edge of the first passband image 1603, and stopband 1613 with finite attenuation. Also shown are the first images of the filter stopband, transition band and passband as 1614, 1615 and 1616 respectively, and first image 1619 of the lower end 1617 of transition band 1612.

FIG. 16C shows the spectrum of the first intermediate signal, including passband 1621 and the lowest unfiltered passband image 1622.

FIG. 16D shows the desired parameters for the filter of interpolator 1504, including passband ripple 1631, wider transition band 1632 whose lower end is no lower than the lower end 1617 of half-band filter transition band 1612, and whose upper end is below the first image 1619 of the lower end 1617 of half-band filter transition band 1612, and stopband 1633 with finite attenuation.

FIG. 16E shows the result of the interpolator filtering operation with passband 1641 unchanged (apart from the effects of passband ripple) and all images attenuated by the stopbands.

It will be noted at this point that the operation is identical to that of the embodiment of FIG. 10, except that the interpolator 1504 is producing an intermediate signal of a sample rate twice the output rate which is yet to be applied to half-band decimating filter 1506. In the case when the input sample rate is lower or approximately equal to the output rate, the input passband 1601, now available at the interpolator output as passband 1641, will be smaller than the available output passband, and thus not require any further filtering. Indeed, half-band decimating filter 1506 will leave this entire smaller passband unchanged as is desired. But if the input sample rate exceeds the output sample rate, which in this case it can do by nearly a factor of three, the passband 1641 requires further filtering to prevent aliasing on decimation.

FIG. 16F shows the spectrum allocation of the output signal which has been scaled for the interesting case when it is slightly higher than one-third the input sample rate, including passband frequency range 1651, guardband 1652, first image 1653, second image 1654, and third image 1655. Images above the third are not shown.

The desired parameters for half-band decimating filter 1506 are shown lower in FIG. 16G. These include passband ripple 1661, transition band 1662 of width less than or equal to twice the output guardband whose lower end 1667 must be no lower than the upper edge of output signal passband 1651, and whose upper end 1668 must be below the lower edge of the first output passband image 1653, stopband 1663 with finite attenuation, and first images of the stopband, transition band and passband as 1664, 1665 and 1666 respectively.

FIG. 16H shows the spectrum of the signal resulting from the final half-band filtering operation prior to decimation, including passband 1671 and partially attenuated intermediate signal 1672.

FIG. 16I shows the decimated output signal, including passband 1681 unchanged (apart from the effects of passband ripple) and partially attenuated intermediate signal 1682 and its alias 1683 limited entirely to within the output guardband, thus containing no significant aliasing within the passband.

While all of the above embodiments presume the less conservative interpretation that allows guardband aliasing to occur, the same principles apply to the design of sample rate converters that take the more conservative approach which precludes guardband aliasing. The scope of the invention, therefore, should not be determined with reference to the above description, but should be determined with reference to the appended claims along with their full scope of equivalents.

What is claimed is:

1. A computer-readable storage medium embodying computer executable instructions for converting an input signal at an input sample rate to one of a plurality of differing intended output sample rates, the instructions comprising:
   code for receiving a plurality of data points, associated with the input signal, at the input sample rate;
   code for operating on said plurality of data points to associate said input signal with a predetermined set of parameters, with said set of parameters including a first transition band having a first width;
   for said plurality of data points, code for controllably converting said input sample rate to any one of said plurality of differing output sample rates for any output data sample in response to a variation in an intended rational sample rate conversion ratio by converting said input sample rate associated with said signal to any one of the plurality of differing intended output sample rates by interpolating a subset of data points of said plurality of data points with an interpolator implementing an interpolation equation and having associated therewith a second transition band, with the width associated with said second transition band being a function of a spectral separation of said first transition band and said image; and
   code for producing an output signal having a sequence of data samples approximating the input signal.

2. The computer-readable storage medium as recited in claim 1 wherein converting said input sample rate includes producing each data sample associated with said second signal by convolving a predetermined finite number N of data points with an equal number of coefficients, with N being greater than two.

3. The computer-readable storage medium as recited in claim 2 wherein coefficients vary as a function of the temporal spacing between the output point and the corresponding input points.

4. The computer-readable storage medium as recited in claim 1 wherein converting said input sample rate decreases said input sample rate.

5. The computer-readable storage medium as recited in claim 1 wherein converting said input sample rate decreases said input sample rate.

6. The computer-readable storage medium as recited in claim 1 wherein operating on said plurality of data points includes up-sampling said plurality of data points by a factor of two.

7. The computer-readable storage medium as recited in claim 6 further including code for decimating a plurality of data points output by said interpolator with a half-band decimator, with converting said input sample rate occurring after receiving said plurality of data points and before decimating said plurality of data points.

8. The computer-readable storage medium as recited in claim 1 wherein operating on said plurality of data points to associate said input signal includes filtering the same with a finite impulse response filter.

9. The computer-readable storage medium as recited in claim 1 wherein operating on said plurality of data points to associate said signal includes filtering the same with an infinite impulse response filter.

10. The computer-readable storage medium as recited in claim 1 wherein code for operating on said plurality of data points includes code for up-sampling said plurality of data points by a factor of two.

11. The computer-readable storage medium as recited in claim 1 wherein code for operating on said plurality of data points includes code for filtering said plurality of data points with a half-band filter.

12. The computer-readable storage medium as recited in claim 1 wherein code for operating on said plurality of data points includes code for decimating said plurality of data points with a half-band decimator.

13. The computer-readable storage medium as recited in claim 11 further including code for decimating said plurality of data points with a half-band decimator.

14. The computer-readable storage medium as recited in claim 1 wherein code for operating on said plurality of data points to associate said signal includes code for filtering said data points with a filter selected from the set of filters consisting essentially of a finite impulse response filter and a infinite impulse response filter.

15. A computer-readable storage medium embodying computer executable instructions for converting a digital audio signal at an initial sample rate to a different intended sample rate, the instructions comprising:
   code for receiving a plurality of data points, associated with an audio signal, at an initial sample rate;
   code for halfband filtering said plurality of data points with a halfband filter to provide intermediate data points, said halfband filter having a first transition band with an image corresponding thereto;
   code for interpolating the intermediate data points with an interpolator utilizing an interpolation equation and having independently programmable parameters and a second transition band, with a width associated with the second transition band being a function of the spectral separation of said first transition band and said image, and wherein the different sample rate is provided by interpolating at least a subset of the intermediate data points based on the independently programmable parameters, and wherein said different sample rate is controllably varied at any output data sample by interpolation; and
   code for producing an output signal at the different sample rate.

16. The computer-readable storage medium as recited in claim 15 wherein:
   said halfband filtering is done in conjunction with upsampling said plurality of data points;
   said interpolating follows said halfband filtering; and
   halfband filtering and decimating follow said interpolating.

17. The computer-readable storage medium as recited in claim 15 wherein:
   said code for halfband filtering is executable in conjunction with code for upsampling said plurality of data points; and
   said code for interpolating is executable following said upsampling and halfband filtering code.

18. The computer-readable storage medium as recited in claim 15 wherein:
   said code for halfband filtering is executable, without upsampling code, on said plurality of datapoints; and
   said code for interpolating is executable following said halfband filtering code.

19. The computer-readable storage medium as recited in claim 15 wherein:
   code for additional halfband filtering is executable following said code for interpolating.

20. The computer-readable storage medium as recited in claim 15 wherein:
   said code for halfband filtering is executable in conjunction with code for upsampling said plurality of data points;
   said code for interpolating is executable following said code for halfband filtering; and further comprising:
   code for halfband filtering and decimating executable follows said code for interpolating.

21. The computer-readable storage medium as recited in claims 1 or 15 wherein said interpolator is an FIR Nth order sum of products interpolator with linear interpolation of coefficients.

22. The computer-readable storage medium as recited in claims 1 or 15 wherein said interpolator has a transition band beginning adjacent the top of a passband and ending adjacent the bottom of a passband image.

23. The computer-readable storage medium of claims 12 or 15 wherein said halfband filter is an IIR filter composed of first order allpass blocks.

24. A sample rate converter to convert an input signal at an input sample rate to one of a plurality of differing intended output sample rates, the sample rate converter comprising:
   circuitry to receive a plurality of data points, associated with the input signal, at the input sample rate;
   a filter to operate on said plurality of data points to associate said input signal with a predetermined set of parameters, with said set of parameters including a first transition band having a first width;
   an interpolator to, for said plurality of data points, controllably convert said input sample rate to any one of said plurality of differing output sample rates for any output data sample in response to a variation in an intended rational sample rate conversion ratio by converting said input sample rate associated with said signal to any one of the plurality of differing intended output sample rates by interpolating a subset of data points of said plurality of data points with an interpolator implementing an interpolation equation and having associated therewith a second transition band, with the width associated with said second transition band being a function of a spectral separation of said first transition band and said image; and circuitry to produce an output signal having a sequence of data samples approximating the input signal.

25. The sample rate converter as recited in claim 24 wherein to convert said input sample rate produces each data sample associated with said second signal by convolving a predetermined finite number N of data points with an equal number of coefficients, with N being greater than two.

26. The sample rate converter as recited in claim 25 wherein the coefficients vary as a function of the temporal spacing between the output point and the corresponding input points.

27. The sample rate converter as recited in claim 24 wherein to convert said input sample rate increases said input sample rate.

28. The sample rate converter as recited in claim 24 wherein to convert said input sample rate decreases said input sample rate.

29. The sample rate converter as recited in claim 24 wherein to operate on said plurality of data points includes up-sampling said plurality of data points by a factor of two.

30. The sample rate converter as recited in claim 29 further comprising a half-band decimator to decimate a plurality of data points output by said interpolator, with the conversion of said input sample rate occurring after receiving said plurality of data points and before decimating said plurality of data points.

31. The sample rate converter as recited in claim 24 which comprises a finite impulse response filter to operate on said plurality of data points.

32. The sample rate converter as recited in claim 24 which comprises an infinite impulse response filter to operate on said plurality of data points.

33. A sample rate converter to convert a digital audio signal at an initial sample rate to a different intended sample rate, the sample rate converter comprising:

circuitry to receive a plurality of data points, associated with an audio signal, at an initial sample rate;

a halfband filter to halfband filter said plurality of data points to provide intermediate data points, said halfband filter having a first transition band with an image corresponding thereto;

an interpolator to interpolate the intermediate data points utilizing an interpolation equation and having independently programmable parameters and a second transition band, with a width associated with the second transition band being a function of the spectral separation of said first transition band and said image, and wherein the different sample rate is provided by interpolating at least a subset of the intermediate data points based on the independently programmable parameters, and wherein said different sample rate is controllably varied at any output data sample by interpolation; and circuitry to produce an output signal at the different sample rate.

34. The sample rate converter as recited in claim 33 wherein the halfband filtering is performed in conjunction with the upsampling of said plurality of data points, and the interpolating is performed following said upsampling and halfband filtering.

35. The sample rate converter as recited in claim 33 wherein the halfband filtering is performed without upsampling said plurality of data points, and the interpolation is performed following said halfband filtering.

36. The sample rate converter as recited in claim 33 wherein additional halfband filtering is performed following the interpolation.

37. The sample rate converter as recited in claim 33 wherein:

the halfband filtering is performed in conjunction with the upsampling of said plurality of data points;

the interpolation is performed following said halfband filtering; and the halfband filtering and decimating follows said interpolation.

38. The sample rate converter as recited in claims 24 or 33 wherein said interpolator is an FIR Nth order sum of products interpolator with linear interpolation of coefficients.

39. The sample rate converter as recited in claim 24 or 33 wherein said interpolator is configured to have a transition band beginning adjacent the top of a passband and ending adjacent the bottom of a passband image.

* * * * *

UNITED STATES PATENT AND TRADEMARK OFFICE
CERTIFICATE OF CORRECTION

PATENT NO. : 7,280,878 B1
APPLICATION NO. : 09/427815
DATED : October 9, 2007
INVENTOR(S) : Rossum It is certified that error appears in the above-identified patent and that said Letters Patent is hereby corrected as shown below:

On page 2, in Item (56), under "Other Publications", in column 1, line 36, delete "Franctional" and insert -- Fractional --, therefor.

On page 2, in Item (56), under "Other Publications", in column 2, line 15, delete "Totorial" and insert -- Tutorial --, therefor.

In column 4, line 2, delete "$F_{sy}$" and insert -- $F_{SY}$ --, therefor.

In column 4, line 45, delete "28 kH," and insert -- 28 kHz, --, therefor.

In column 5, line 31, delete "$sinc^n$." and insert -- $sine^n$. --, therefor.

In column 6, line 7, delete "sinc" and insert -- sine --, therefor.

In column 7, line 48, delete "simplier." and insert -- simpler. --, therefor.

In column 7, line 49, delete "preferrably" and insert -- preferably --, therefor.

In column 10, line 13, after "$C_1(f)$" delete ")".

In column 11, line 47, delete "sinc" and insert -- sine --, therefor.

In column 11, line 49, delete "sinc" and insert -- sine --, therefor.

In column 12, line 47, delete "Wk," and insert -- $w_k$, --, therefor.

In column 14, line 56, delete "$X^1_n$" and insert -- $x^1_n$ --, therefor.

In column 19, line 35, in Claim 13, delete "claim 11" and insert -- claim 10 --, therefor.

In column 20, line 19, in Claim 18, delete "datapoints;" and insert -- data points; --, therefor.

UNITED STATES PATENT AND TRADEMARK OFFICE
CERTIFICATE OF CORRECTION

PATENT NO. : 7,280,878 B1
APPLICATION NO. : 09/427815
DATED : October 9, 2007
INVENTOR(S) : Rossum It is certified that error appears in the above-identified patent and that said Letters Patent is hereby corrected as shown below:

In column 20, line 43, in Claim 23, delete "claims 12" and insert -- claims 11 --, therefor.

Signed and Sealed this

Fourth Day of November, 2008

JON W. DUDAS
*Director of the United States Patent and Trademark Office*